(12) United States Patent
Kalfon et al.

(10) Patent No.: US 8,681,698 B2
(45) Date of Patent: Mar. 25, 2014

(54) RATE MATCHING FOR WIDEBAND CODE DIVISION MULTIPLE ACCESS

(75) Inventors: Shai Kalfon, Hod HaSharon (IL); Moshe Bukris, Rishon-LeZion (IL)

(73) Assignee: LSI Corporation, Milpitas, CA (US)

( * ) Notice: Subject to any disclaimer, the term of this patent is extended or adjusted under 35 U.S.C. 154(b) by 389 days.

(21) Appl. No.: 13/097,317

(22) Filed: Apr. 29, 2011

(65) Prior Publication Data

US 2012/0275374 A1 Nov. 1, 2012

(51) Int. Cl.
*H04W 4/00* (2009.01)

(52) U.S. Cl.
USPC ........... 370/328; 370/342; 370/345; 370/335; 714/781; 714/786; 714/774

(58) Field of Classification Search
USPC .......... 370/328, 342, 329, 345, 335; 714/781, 714/786, 774, 755
See application file for complete search history.

(56) References Cited

U.S. PATENT DOCUMENTS

| 6,622,281 | B1 * | 9/2003 | Yun et al. | 714/790 |
| 6,888,851 | B1 * | 5/2005 | Qian | 370/523 |
| 7,131,049 | B2 * | 10/2006 | Kim et al. | 714/751 |
| 7,272,191 | B2 * | 9/2007 | Taffin et al. | 375/261 |
| 7,293,217 | B2 * | 11/2007 | Pietraski et al. | 714/755 |
| 2003/0171121 | A1 * | 9/2003 | Kim et al. | 455/451 |
| 2009/0316677 | A1 * | 12/2009 | Kikuchi et al. | 370/345 |

FOREIGN PATENT DOCUMENTS

EP 1 211 858 A3 11/2005

* cited by examiner

*Primary Examiner* — Rasheed Gidado

(57) ABSTRACT

Described embodiments provide a wideband code division multiple access (W-CDMA) system that employs a rate matching rule having a modified puncturing algorithm. The modified puncturing algorithm defines the input variables of the rate matching rule in a manner that provides for identification of relations between non-punctured data bit position addresses in the output data stream through an iterative process, from which absolute bit position addresses of non-punctured output bits might then be generated. A counter, in accordance with instruction generated by a processor or state machine, for example, might implement the modified puncturing algorithm on an input string of bits to provide an output string of bits based on the absolute bit position addresses of non-punctured output bits, thereby providing for rate matching in the communications channel.

13 Claims, 4 Drawing Sheets

200

400

RATE MATCHING FOR WIDEBAND CODE DIVISION MULTIPLE ACCESS

BACKGROUND OF THE INVENTION

1. Field of the Invention

The present invention relates to communication systems, in particular, wideband code division multiple access (W-CDMA) systems with rate matching.

2. Description of the Related Art

Code Division Multiple Access (CDMA) is a channel access method used by radio communication technologies. CDMA enables signals to be multiplexed over the same channel by assigning each transmitter a code. The data bits are combined with a code so that the signal can only be intercepted by a receiver whose frequency response is programmed with the same code. The code changes at the chipping rate which is much faster than the original sequence of data bits. The result of combining the data signal with the code is a spread spectrum signal that resists interference and enables the original data to be recovered if the original data bits are damaged during transmission. CDMA technology optimizes the use of available bandwidth, and is used in communications such as ultra-high frequency cellular telephone systems.

Wideband CDMA (W-CDMA) is an International Telecommunications Standard (ITU) derived from CDMA technology. The code in W-CDMA technology is a wideband spread signal. W-CDMA is found in communications such as 3G mobile telecommunications networks. W-CDMA transmits on a pair of 5 MHz-wide carrier channels, whereas narrowband CDMA transmits on 200 kHz-wide channels. W-CDMA has been developed into a complete set of specifications. Specifically, details on W-CDMA multiplexing, channel coding and interleaving are described in "3rd Generation Partnership Project (3GPP); Technical Specification Group Radio Access Network; Multiplexing and channel coding (FDD) (3GPP TS 25.212)", hereinafter referred to as "TS 25.212". TS 25.212 defines rate matching parameter calculation schemes and a rate matching pattern algorithm.

In general, rate matching is used to match the number of bits to be transmitted to the number available in a single frame. The number of bits on a transport channel can vary between different time intervals. In the downlink the transmission is interrupted if the number of bits is lower than maximum. When the number of bits between different transmission time intervals in the uplink is changed, bits are repeated or punctured to ensure that the total bit rate after transport channel multiplexing is identical to the total channel bit rate of the allocated dedicated physical channels. Rate matching algorithms either repeat bits on a transport channel to increase the rate or puncture bits on a transport channel to decrease the rate. For example, rate matching is critical to meet certain quality of service (QoS) requirements in wireless communication systems.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a wideband code division multiple access (W-CDMA) system, operating in accordance with a 3GPP standard, that employs a rate matching rule having a modified puncturing algorithm. Rate matching, by puncturing, includes generating, by a puncturing algorithm, a relation between output bit position addresses of non-punctured bits based on a difference value, a counter step of a counter, an integer number, a dynamic remainder, and a set remainder, wherein the counter step is based on the difference value, the integer number, and the set remainder. A counter is initialized. A non-punctured bit position address is provided during an iteration, the non-punctured bit position address representing an integer value of the counter and the non-integer value of the counter related to the difference value and the dynamic remainder. A state machine or processor then updates, based on the counter step, the counter to generate a new integer value representing a next non-punctured bit position address and an updated remainder. This providing and updating is repeated for each subsequent iteration, thereby providing rate matching between an input data stream and an output data stream for a transport channel.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with embodiments of the present invention, a wideband code division multiple access (W-CDMA) system employs a rate matching rule having a modified puncturing algorithm. The modified puncturing algorithm defines the input variables of the rate matching rule in a manner that provides for identification of relations between non-punctured data bit position addresses in the output data stream through an iterative process, from which absolute bit position addresses of non-punctured output bits might then be generated. A counter, in accordance with instruction generated by a processor or state machine, for example, might implement the modified puncturing algorithm on an input string of bits to provide an output string of bits based on the absolute bit position addresses of non-punctured output bits, thereby providing for rate matching in the communications channel. Embodiments of the present invention thus provide for the advantage of reduced complexity and faster processing speed when applying rate matching rules in W-CDMA communication systems.

Figure 1:
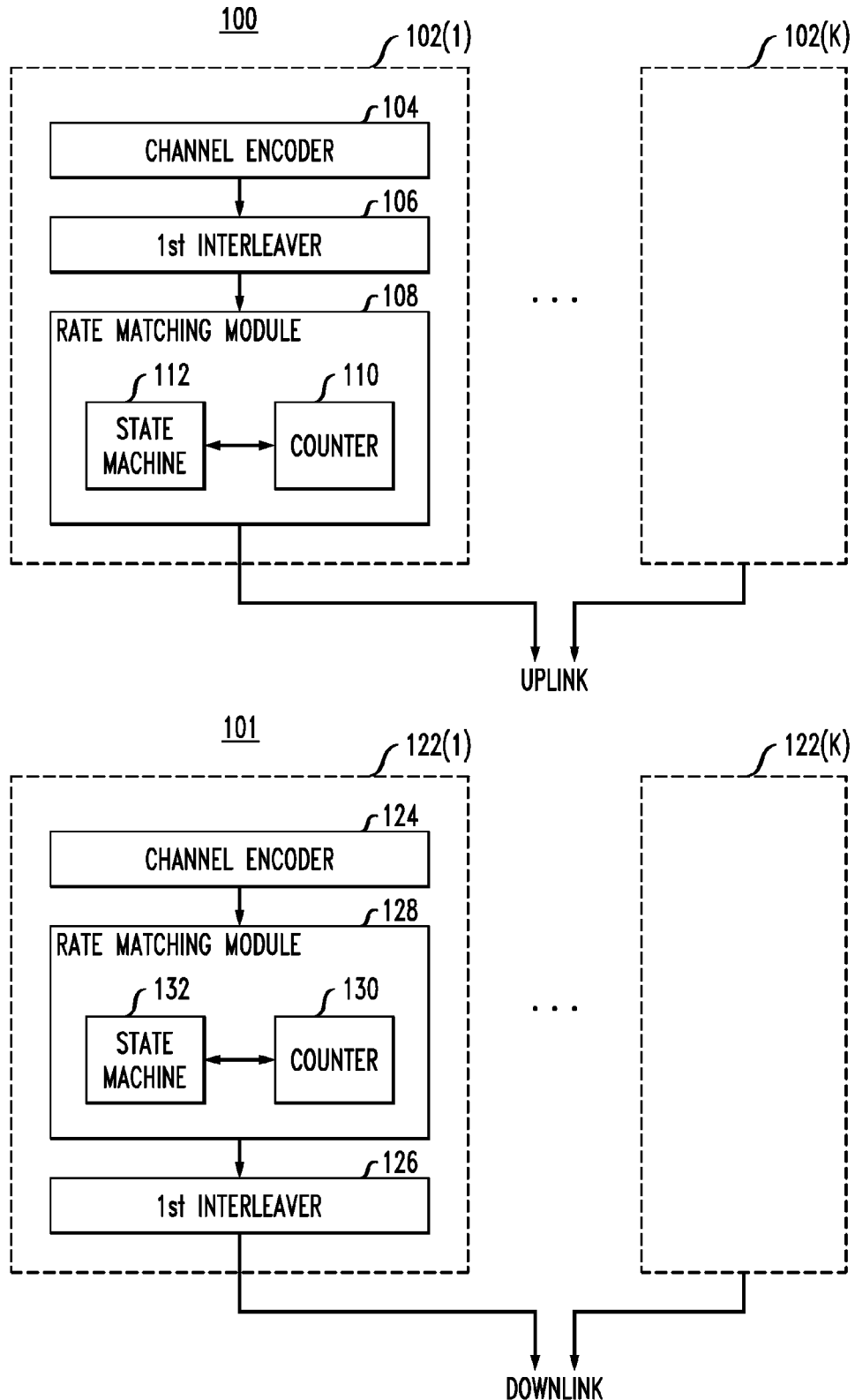
FIG. 1 shows an exemplary system employing rate matching in accordance with a 3GPP standard operating in accordance with exemplary embodiments of the present invention.

FIG. 1 shows W-CDMA system uplink and downlink portions 100 and 101, respectively, employing a rate matching rule having a modified puncturing algorithm operating in accordance with exemplary embodiments of the present invention. In uplink 100, data streams of several transport channel blocks 102(1)-102(K) having, for example, the same quality of service (hereafter "QoS") are processed. For example, transport channel block 102(1) provides for a channel coding by channel encoder 104 according to a desired code rate, and then are branched off into several sequences. These sequences are then interleaved by 1st interleaver 106 in code-symbol by code-symbol units. After interleaving, sequences undergo the rate matching by rate matching module 108 using a modified puncturing algorithm in accordance with embodiments of the present invention, as described subsequently. Rate matching module 108 might employ counter 110 and state machine 112 to implement the modified puncturing algorithm.

In the downlink 101, transport channel data streams of several transport channel blocks 122(1)-122(K) having the same QoS are processed. For example, in transport channel block 122(1), the data stream is subject to a channel coding by channel encoder 124 according to a desired code rate, and then are branched off into several sequences. The sequences of the respective branches then undergo rate matching by rate matching module 128 using the modified puncturing algorithm in accordance with embodiments of the present invention, as described subsequently. Rate matching module 128 might employ counter 130 and state machine 132 to implement the modified puncturing algorithm. From rate matching module 128, the sequences are then interleaved by 1st interleaver 126 in code-symbol by code-symbol units. In the channel coding applicable to the transport channel (TrCH) of the uplink or downlink, convolutional coding and turbo coding (not shown in FIG. 1) might also be employed, or other specific channel coding may be applied thereto. A multi-stage interleaver (MIL) might typically be used to perform the 1st interleaving in the uplink or the downlink.

As an aid to understanding the present invention, Section 4.2.7.5 of 3GPP TS 25.212 specifies a rate matching rule for puncturing for W-CDMA communication systems operating in accordance with the standard. Bits input to the rate matcher are denoted by $x_{i1}, x_{i2}, x_{i3}, \ldots x_{iXi}$, where i is the transport channel (TrCh) number and X represents a total number of data bits in the ith TrCh. Parameters $X_i$, $e_{ini}$, $e_{plus}$, and $e_{minus}$ are given in Section 4.2.7.1 of 3GPP TS 25.212 for uplink communications and in Section 4.2.7.2 of 3GPP TS 25.212 for downlink communications. For example, rate matching parameter $X_i = N_{ij}$ for convolutionally encoded TrChs in the uplink, where $N_{ij}$ represents the number of bits in a radio frame before rate matching on the ith TrCh with a jth transport format combination. Other rate matching parameters in an uplink, convolutionally encoded, TrCh are defined as follows.

Variable $e_{ini}$ represents the initial error between a current puncturing ratio and the desired puncturing ratio as seen when interleaving by the first interleaver. The variable $e_{ini}$ is equivalent to: $(a \times S[P1_{Fi}(n_i)] \times |\Delta N_r| + 1) \mod (a \cdot N_{ij})$, where: (i) $P1_F(n_i)$ represents the column permutation function of the first interleaver (e.g., $P1_F(x)$ is the original position of column with number x after permutation), (ii) $n_i$ represents the radio frame number in the transmission time interval of TrCH i, (iii) S[n] represents the shift of the puncturing pattern for radio frame $n_i$ when $n = P1_{Fi}(n_i)$, (iv) $\Delta N_i$ represents the number of bits that should be repeated (if $\Delta N_i$ is positive) or punctured (if $\Delta N_i$ is negative) in each radio frame on TrChi, and (v) a=2. The variable $e_{plus}$ is defined as $(a \times N_{ij})$; and the variable $e_{minus}$ is defined as $(a \times |\Delta N_i|)$.

The iterative puncturing process for rate matching defined in Section 4.2.7.5 of 3GPP TS 25.212 utilizes these rate matching parameters to reduce the number of input bits when $\Delta Ni$ is negative. The puncturing procedure starts and sets current error variable e to $e_{ini}$. The variable e represents an error between the current and the desired puncturing ratios. The puncturing process sets bit index m to 1 and a test determines whether m is less than or equal to $X_i$ ($m \leq X_i$). If m is less than or equal to $X_i$, the puncturing process decrements the value of e by the value of $e_{minus}$ (thus, $e = e - e_{minus}$). Next, a test determines whether bit at index number m should be punctured by determining whether $e \leq 0$. If $e \leq 0$, then bit $x_{i,m}$ is removed from the bit sequence by setting bit $x_{i,m}$ to $\delta$, where $\delta \in \{0, 1\}$. The error between the current and desired puncturing ratio is then updated by setting the variable e to $e + e_{plus}$, and the iteration completes. The puncturing process advances to check the next bit by incrementing the value of bit index m, where bit index m is increased by, for example, "1". Again, a test checks the value of error e and, if $e > 0$, the puncturing procedure proceeds and then continues to check the next bit. This process of checking the error and puncturing continues until the bit index m increases such that $m > X_i$, where the puncturing process ends.

Embodiments of the present invention might modify this puncturing process specified in the 3GPP TS 25.212 to a modified puncturing algorithm that allows for absolute output bit position address determination in each iteration (providing a substantially similar result as the puncturing process for rate matching defined in Section 4.2.7.5 of 3GPP TS 25.212) with newly defined variables as follows. First, the value $Loc_j$ represents the desired output address value of the non-punctured bit at the jth iteration. $Loc_j$ is defined by the relation $Loc_j = (Loc_{j-1} + loc_j)$, where $Loc_j$ is the desired output address value of the j bit address location, and $loc_j$ is the offset of the j bit location relative to the previous j−1 bit address location $Loc_{j-1}$. The difference value $\Delta$ is defined as $\Delta \equiv e_{plus} - e_{minus} \equiv e^+ - e^-$, and the variable $e^-$ is defined as $e^- \equiv (NUM \Delta + REM)$, where e represents the step of the counter in the original puncturing algorithm, NUM is defined as the integer number $$NUM = \left\lfloor \frac{e^-}{\Delta} \right\rfloor,$$

and REM represents a set remainder $REM = e^- - NUM \Delta$. The variable $e_{ini}$ is set to $rem_0$, where $e_{ini}$ represents the initial condition of the counter in the original puncturing algorithm, and $rem_0$ represents an initial dynamically changing remainder value at process start, while $rem_{j+1}$ represents a remainder value at the jth iteration.

Using these newly defined variables and parameters above, at the jth iteration, a new bit offset $loc_j$ relative to bit position (address) $Loc_{j-1}$ complies with the following mathematical relation (1):

$$e^- - rem_j + rem_{j+1} = (NUM \Delta + REM) - rem_j + rem_{j+1} = loc_j \Delta;$$
$$j = 0, 1, 2, \qquad (1)$$

where $loc_j$ and $rem_{j-1}$ are the desired, calculated offset and remainder values, respectively. The mathematical compliance of each $loc_j$, each of which represents an offset of the non-punctured output bit relative to bit position $Loc_{j-1}$, is demonstrated in scheme 200 shown in FIG. 2. Described embodiments lower the complexity required to find offsets $loc_j$ of the non-punctured bits in the output bit stream.

Figure 2:
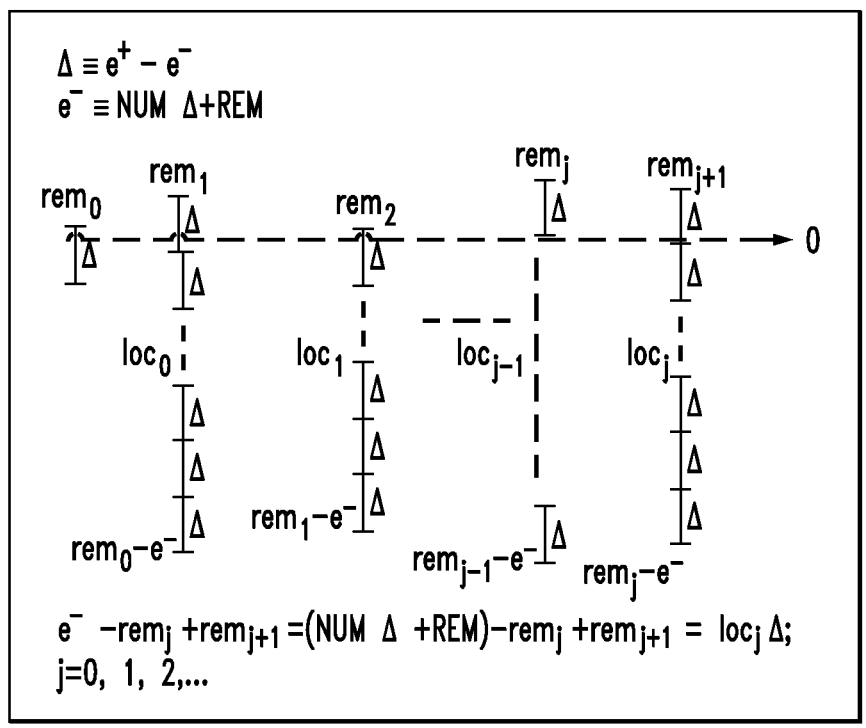
FIG. 2 shows mathematical compliance of each offset of non-punctured output bits for the exemplary system of FIG. 1.
Figure 3:
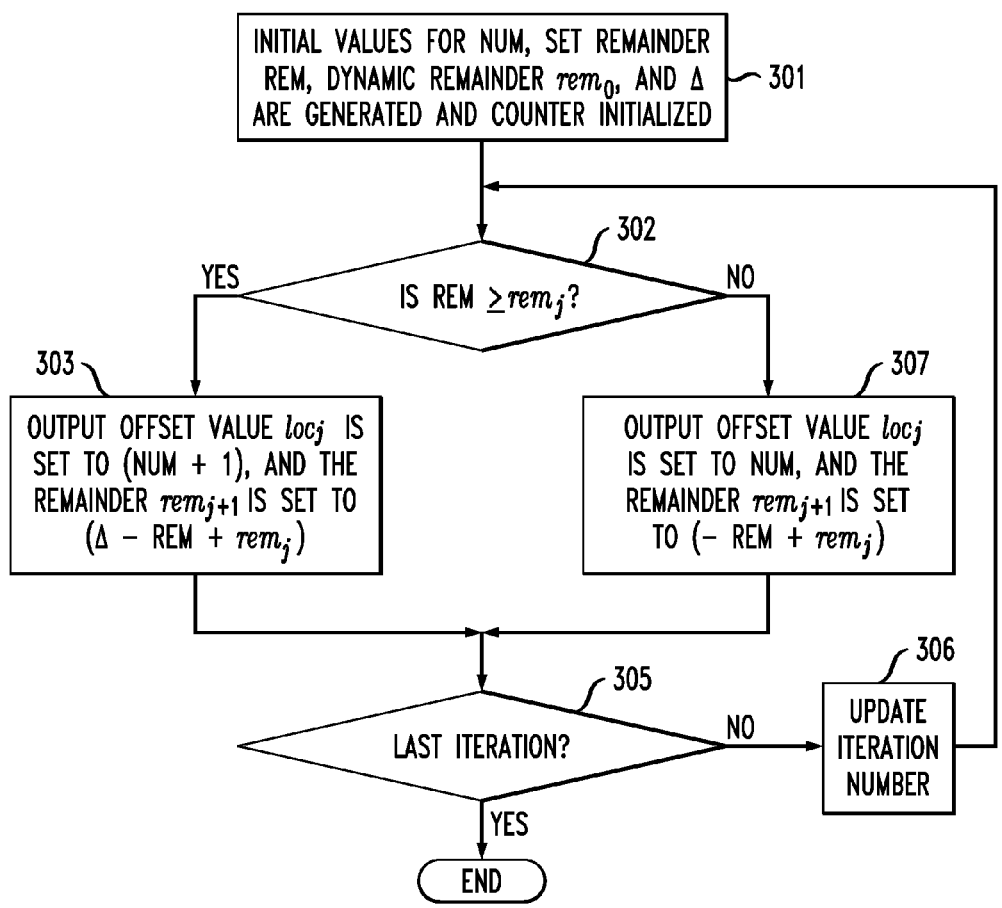
FIG. 3 shows a first exemplary method for puncturing bits with relative offset determination in accordance with a 3GPP standard as employed by the system of FIG. 1.

In a first exemplary embodiment, method 300 of FIG. 3 might determine relative offsets of non-punctured bits $loc_j$ at the jth iteration re-formulating the relation (1) based on compliance of FIG. 2 in accordance with the following relations (2a), (2b) and (2c):

$$REM - rem_j + rem_{j+1} = \Delta, \text{ if } REM \geq rem_j; \text{ and} = 0, \text{ if } REM < rem_j; \qquad (2a)$$

$$loc_j = NUM + 1, \text{ if } REM \geq rem_j; \text{ and} = NUM, \text{ if } REM < rem_j; \qquad (2b)$$

$rem_{j+1}=\Delta-REM+rem_j$, if $REM \geq rem_j$; and $=-REM+rem_j$, if $REM<rem_j$; (2c)

Referring to FIG. 3, at step 301, the initial values for NUM, REM, $\Delta$, and remainder $rem_0$, are generated and the counter initialized (the initial iteration j is set to j=0). At step 302, a test determines whether REM satisfies $REM \geq rem_j$ and, if so, advances to step 303. At step 303, the output offset value $loc_j$ is set to (NUM+1), and the remainder $rem_{j+1}$ is set to ($\Delta$-REM+$rem_j$). Since the offset $loc_j$ is relative to the address $Loc_{j-1}$, the new address $Loc_j$ is equivalent to $(Loc_{j-1}+loc_j)$, so the value $Loc_j$ is defined as $(Loc_{j-1}+loc_j)$. At step 305, a test determines whether j has reached the final iteration value, and, if so, the method ends. If, at step 305, the test determines that j has not reached the final iteration value, at step 306, the iteration j is incremented to (j+1) and the method returns to step 302.

If the test of step 302 determines that REM does not satisfy $REM \geq rem_j$, then the method advances to step 307. At step 307, the output offset value $loc_j$ is set to NUM, and the remainder $rem_{j+1}$ is set to (-REM+rem), and the method advances to step 305, described previously.

In a second exemplary embodiment, a method might determine an absolute address of non-punctured bits instead of determining relative offsets of non-punctured bits. As described above with respect to the first exemplary embodiment, since the offset $loc_j$ is relative to the address $Loc_{j-1}$, the absolute address value $Loc_j$ is equivalent to $(Loc_{j-1}+loc_j)$, so the value $Loc_j$ is defined as $(Loc_{j-1}+loc_j)$ (e.g., $Loc_1$ is equal to $Loc_0+loc_1$, where $Loc_0=loc_0$). For example, inserting $loc_o$ and $loc_1$ into the relation (1) yields the following expressions given in relation (3):

$NUM\Delta+\Delta+REM-rem_0+rem_1=loc_0\Delta+\Delta$ $NUM\Delta+REM-rem_1+rem_2=loc_1\Delta$ (3)

In order to obtain the absolute address, the two independent relative offset relations (e.g., $loc_o$ and $loc_1$) might be summed as shown below to provide the relation (4):

$NUM\Delta+\Delta+REM-rem_0+rem_1=loc_0\Delta+\Delta$

+

$NUM\Delta+REM-rem_1+rem_2=loc_1\Delta$

=

$2(NUM\Delta+REM)+\Delta-rem_0=(loc_0+loc_1)\Delta+\Delta-rem_2=Loc_1\Delta+\Delta-rem_2$ (4)

The above relation (4) shows that, by adding (NUM$\Delta$+REM) to the left side of the expression that corresponds to $loc_0$, the new location $Loc_1=(loc_0+loc_1)$ is generated. For example, in the above expression $rem_1$ is generally not calculated and the new remainder value ($\Delta-rem_2$) is automatically generated. In the next iteration, for example, $Loc_2=(loc_0+loc_1+loc_2)$, and the remainder values $rem_3$ generated and $rem_2$ omitted.

The absolute addresses might be expressed as follows without loss of generality. For example, at iteration j, the following mathematical relation expresses the new address and the new remainder as given in relation (5):

$(j+1)(NUM\Delta+REM)+\Delta-rem_0=(loc_0+loc_1+,\ldots,+loc_j)\Delta+\Delta-rem_{j+1}=Loc_j\Delta+\Delta-rem_{j+1}$ (5)

The next relative offset ($loc_{j+1}$) for iteration j+1 using relation (1) complies with the following relation (6):

$e_-rem_{j+1}+rem_{j+2}=NUM\Delta+REM-rem_{j+1}+rem_{j+2}=loc_{j+1}\Delta$ (6)

By re-ordering and adding the absolute address relation (5) with the relative offset relation (6), the next new absolute address ($Loc_{j+1}$) and its new remainder ($rem_{j+2}$) are generated as expressed in the following relation (7):

$(j+2)(NUM\Delta+REM)+\Delta-rem_0=$ (7)

$$\left(\sum_{k=0}^{j+1} loc_k\right)\Delta+\Delta-rem_{j+2} = Loc_{j+1}\Delta+\Delta-rem_{j+2}$$

For example, in the above expression $rem_{j+1}$ is not calculated and the new remainder value $\Delta-rem_{j+2}$ is automatically generated. In order to generate a new absolute address with an appropriate remainder for the next iteration, NUM $\Delta$+REM might be added to the left side of the above equation.

In described embodiments, the above relation (7) might be divided by $\Delta$ so that the step of the counter, such as counter 130 shown in FIG. 1, is the integer part $Loc_{j+1}$ and a remainder part $$1 - \frac{rem_{j+2}}{\Delta}.$$

The initial condition of the counter might be set to $(1-rem_0\Delta)$. In embodiments of the present invention, the counter is used to generate the absolute address, so the counter might be composed of i) an integer part providing the new absolute address $Loc_{j+1}$ and ii) a remainder part $(1-rem_{j+2}/\Delta)$ from which the remainder (e.g., $rem_{j+2}$) is derived for the next step.

Figure 4:
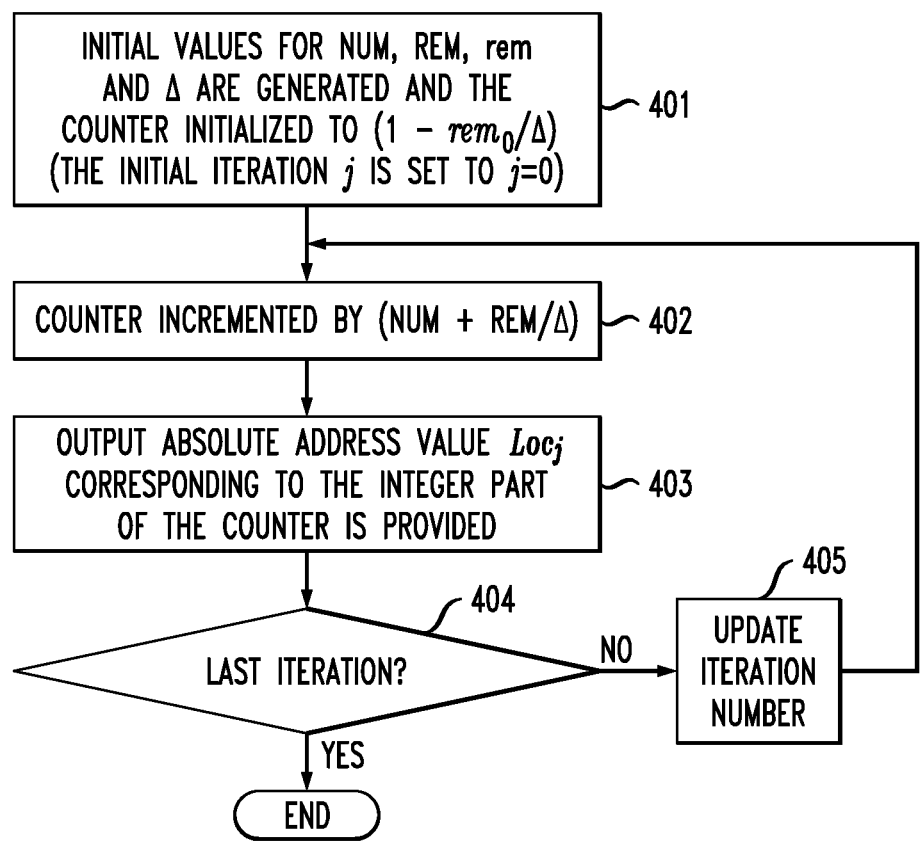
FIG. 4 shows a second exemplary method for puncturing bits with absolute address determination in accordance with a 3GPP standard as employed by the system of FIG. 1.

FIG. 4 shows an exemplary method as might be employed by the second exemplary embodiment. Referring to FIG. 4, at step 401, the initial values for NUM, REM, $rem_0$ and $\Delta$ are generated and the counter initialized to $(1-rem_0/\Delta)$ (the initial iteration j is set to j=0). At step 402, the counter is incremented by (NUM+REM/$\Delta$), and the method advances to step 403. At step 403, the output absolute address value $Loc_j$ corresponding to the integer part of the counter is provided. At step 404, a test determines whether j has reached the final iteration value, and, if so, the method ends. If, at step 404, the test determines that j has not reached the final iteration value, at step 405, the iteration j is incremented to (j+1) and the method returns to step 402 for the next counter increment.

For an implementation employing floating point arithmetic, absolute address generation is determined based on a desired accuracy in a relatively straightforward manner. For an implementation employing fixed point arithmetic, a number q of bits required for storage of the fractional part/remainder is defined, which also defines the resolution and accuracy of the counter. The resolution $R_A(q)$ of the counter is $(\Delta/2^q)$, with q-bit remainder part resolution. The counter initial value and the fractional added value transformations for a fixed point case are given in the following relations (8a) and (8b):

for (NUM+(REM/$\Delta$)), the iteration added value transforms to (NUM+(REM/$\Delta$))$2^q$ (8a)

for (1+($rem_0/\Delta$)), the fractional initial value transforms to (1+($rem_0/\Delta$))$2^q$, (8b)

where the maximum quantization error for ceiling or floor is (REM/($\Delta 2^q$)). Thus, the number of iterations is bounded with accounting for quantization error integration. For the iteration j, the maximum total error integration value is bounded as (j REM/($\Delta 2^q$)). The condition that no propagation of the error to the integer part (and so, the absolute bit address) might be expressed as $(j/2^q)<(1/\Delta)$, so $j<(2^q/\Delta)=1/R_A(q)$.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While the exemplary embodiments of the present invention have been described with respect to processing blocks in a software program, including possible implementation as a digital signal processor, micro-controller, or general purpose computer, the present invention is not so limited. As would be apparent to one skilled in the art, various functions of software may also be implemented as processes of circuits. Such circuits may be employed in, for example, a single integrated circuit, a multi-chip module, a single card, or a multi-card circuit pack.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here. It will be further understood that various changes in the details, materials, and arrangements of the parts which have been described and illustrated in order to explain the nature of this invention may be made by those skilled in the art without departing from the scope of the invention as expressed in the following claims.

We claim:

1. A method of rate matching, by puncturing, in a wideband code division multiple access (W-CDMA) device, comprising:

generating, by a puncturing algorithm of a rate matching module of a transport channel of the W-CDMA device, the rate matching module comprising a counter and at least one of a processor and a state machine, a relation between output bit position addresses of non-punctured bits based on a difference value $\Delta$, a counter step of the counter, an integer number NUM, a dynamic remainder $rem_j$, wherein j is an iteration of the rate matching module, and a set remainder REM, wherein the counter step is based on the difference value $\Delta$, the integer number NUM, and the set remainder REM;

by the at least one of a processor and a state machine, initializing the counter and determining an initial value of the dynamic remainder $rem_0$;

determining, by the rate matching module, the counter step by the relation counter step=NUM+REM/$\Delta$;

for each iteration j of the rate matching module:
providing a non-punctured bit position address, the non-punctured bit position address representing an integer value of the counter and a non-integer value of the counter related to the difference value $\Delta$ and an updated dynamic remainder $rem_{j+1}$, by the steps of:
generating a new integer value NUM by incrementing the counter by the counter step and setting NUM equal to the counter;
comparing current values of the set remainder REM and the dynamic remainder $rem_j$;
if the set remainder REM is greater than or equivalent to the dynamic remainder $rem_j$;
setting a non-punctured bit offset to (NUM+1), and setting the updated dynamic remainder $rem_{j+1}$ to ($\Delta$−REM+$rem_j$);
otherwise, if the set remainder REM is less than the dynamic remainder $rem_j$:
setting the non-punctured bit offset to NUM, and setting the updated dynamic remainder $rem_{j+1}$ to (−REM+$rem_j$);
repeating the providing of a non-punctured bit position address for each subsequent iteration until j reaches a maximum value, thereby providing rate matching between an input data stream and an output data stream for a transport channel of the W-CDMA device.

2. The method as recited in claim 1, wherein the integer value of the counter during an iteration represents an absolute non-punctured bit position address.

3. The method as recited in claim 1, wherein:
during a first iteration with a first dynamic remainder $rem_0$, the counter is initialized to (1−$rem_0$/$\Delta$).

4. The method as recited in claim 1, wherein the method is implemented as steps executed by an integrated circuit.

5. The method as recited in claim 1, wherein the method is implemented as steps executed by a wireless handset device.

6. The method as recited in claim 1, wherein the method is implemented by at least one of a wireless handset device and a base station of the W-CDMA system operating in accordance with a 3GPP standard.

7. A wireless handset device operable in a wideband code division multiple access (W-CDMA) system, comprising:
a rate matching module comprising a counter and at least one of a state machine and a processor, the rate matching module configured to generate a relation between output bit position addresses of non-punctured bits based on a difference value $\Delta$, a counter step, an integer number NUM, a dynamic remainder $rem_j$, wherein j is an iteration of the rate matching module, and a set remainder REM, wherein the at least one of the state machine and the processor is configured to initialize the counter, determine an initial value of the dynamic remainder $rem_0$, and determine the counter step by the relation counter step=NUM+REM/$\Delta$;
wherein, during each iteration j, the rate matching module is configured to provide a non-punctured bit address, the non-punctured bit address representing an integer value output of the counter and a non-integer value output of the counter related to the difference $\Delta$ and an updated dynamic remainder $rem_{j+1}$, wherein the rate matching module is configured to:
generate a new integer value NUM by incrementing the counter by the counter step and setting NUM equal to the counter;
compare current values of the set remainder REM and the dynamic remainder $rem_j$;
if the set remainder REM is greater than or equivalent to the dynamic remainder $rem_j$:
the counter is configured to set a non-punctured bit offset to (NUM+1) and set the updated dynamic remainder $rem_{j+1}$ to ($\Delta$-REM+$rem_j$);
otherwise, if the set remainder REM is less than the dynamic remainder $rem_j$:
the counter is configured to set the non-punctured bit offset to NUM and set the updated dynamic remainder $rem_{j+1}$ to (-REM+$rem_j$);
wherein the rate matching module is thereby configured to provide rate matching between an input data stream and an output data stream for a transport channel.

8. The wireless handset device of claim 7, wherein the integer value output of the counter during an iteration represents an absolute non-punctured bit position address.

9. The wireless handset device of claim 7, wherein the state machine is further configured to:
during a first iteration with a first dynamic remainder $rem_0$, initialize the counter to (1-$rem_0$/$\Delta$).

10. The wireless handset device of claim 7, wherein the wireless handset device of the W-CDMA system operates in accordance with a 3GPP standard.

11. A non-transitory machine-readable storage medium, having encoded thereon program code, wherein, when the program code is executed by a machine, the machine implements a method of rate matching, by puncturing, in a wideband code division multiple access (W-CDMA) device, comprising:
generating, by a puncturing algorithm of a rate matching module of a transport channel of the W-CDMA device, the rate matching module comprising a counter and at least one of a processor and a state machine, a relation between output bit position addresses of non-punctured bits based on a difference value $\Delta$, a counter step of the counter, an integer number NUM, a dynamic remainder $rem_j$, where j is an iteration of the rate matching module, and a set remainder REM, wherein the counter step is based on the difference value $\Delta$, the integer number NUM, and the set remainder REM;
by the at least one of a processor and a state machine, initializing the counter and determining an initial value of the dynamic remainder $rem_0$;
determining, by the rate matching module, the counter step by the relation counter step=NUM+REM/$\Delta$;
for each iteration j of the rate matching module:
providing a non-punctured bit position address, the non-punctured bit position address representing an integer value of the counter and a non-integer value of the counter related to the difference value $\Delta$ and an updated dynamic remainder $rem_{j+1}$, by the steps of:
generating a new integer value NUM by incrementing the counter by the counter step and setting NUM equal to the counter;
comparing current values of the set remainder REM and the dynamic remainder $rem_j$;
if the set remainder REM is greater than or equivalent to the dynamic remainder $rem_j$:
setting a non-punctured bit offset to (NUM+1), and setting the updated dynamic remainder $rem_{j+1}$ to ($\Delta$-REM+$rem_j$);
otherwise, if the set remainder REM is less than the dynamic remainder $rem_j$:
setting the non-punctured bit offset to NUM, and setting the undated dynamic remainder $rem_{j+1}$ to (-REM+$rem_j$);
repeating the providing of a non-punctured bit position address for each subsequent iteration until j reaches a maximum value, thereby providing rate matching between an input data stream and an output data stream for a transport channel of the W-CDMA device.

12. The non-transitory machine-readable storage medium as recited in claim 11, wherein the integer value of the counter during an iteration represents an absolute non-punctured bit position address.

13. The non-transitory machine-readable storage medium as recited in claim 11, wherein:
during a first iteration with j=0 with a first dynamic remainder $rem_0$, the counter is initialized to (1-$rem_0$/$\Delta$).

* * * * *